United States Patent
Mayer et al.

(10) Patent No.: US 6,573,448 B2
(45) Date of Patent: Jun. 3, 2003

(54) HOUSING FOR AN ELECTRICAL DEVICE, IN PARTICULAR A SWITCHING DEVICE OR A CONTROL DEVICE IN A MOTOR VEHICLE

(75) Inventors: Frank Mayer, Ludwigsburg (DE); Peter Schiefer, Unterheinried (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/158,354

(22) Filed: May 30, 2002

(65) Prior Publication Data

US 2003/0025393 A1 Feb. 6, 2003

(51) Int. Cl.⁷ .................................................. H05K 5/06
(52) U.S. Cl. ....................... 174/52.3; 439/76.2; 361/752
(58) Field of Search ......................... 174/52.3; 361/752; 439/76.1, 76.2

(56) References Cited

U.S. PATENT DOCUMENTS

| | | | |
|---|---|---|---|
| 4,893,215 A | * | 1/1990 | Urushiwara et al. ........ 361/739 |
| 5,550,324 A | * | 8/1996 | Black et al. ................ 174/52.3 |
| 5,761,046 A | * | 6/1998 | Hein et al. .................. 361/752 |
| 6,407,925 B1 | * | 6/2002 | Kobayashi et al. ......... 361/752 |

FOREIGN PATENT DOCUMENTS

DE        195 16 708        11/1996

* cited by examiner

Primary Examiner—Hung V. Ngo
(74) Attorney, Agent, or Firm—Kenyon & Kenyon

(57) ABSTRACT

An electrical device is provided, including a housing, a base, a cover, and a plug body connected to a printed-circuit board and projecting from housing. To achieve an excellent seal for the housing in a transitional region among the base, the cover, and an intermediate wall of the plug body, a groove is formed in the cover, in which a sealing compound is placed. During assembly of the components, the sealing compound is displaced from the intermediate wall in a region of an additional sealing compound applied to the base, the two sealing compounds meeting in an overlap region.

11 Claims, 2 Drawing Sheets

HOUSING FOR AN ELECTRICAL DEVICE, IN PARTICULAR A SWITCHING DEVICE OR A CONTROL DEVICE IN A MOTOR VEHICLE

FIELD OF THE INVENTION

The present invention relates to an electrical device, in particular, a switching device or a control device in a motor vehicle.

BACKGROUND INFORMATION

To sealingly join housing parts and a plug body to one another to prevent the ingress of moisture into the control-device interior, the individual component parts of the control device may be joined to one another by interposing a separating layer made of a flexible seal, as referred to in German Published Patent Application No. 195 16 708. Critical to production, however, are those joints where more than two parts, for example, the two housing parts and the plug body, come into direct contact, since manufacturing and assembly tolerances accumulate in this area. Sealing problems may therefore arise in series production.

SUMMARY OF THE INVENTION

It is believed that an exemplary electrical device and method according to the present invention, such as a switching or control device in a motor vehicle, have the advantage of achieving a reliable sealing of the control device towards the outside. This is essentially due to a projection of the plug body engaging with a recess in the one housing part, which is provided with sealing compound, in the join region where more than two component parts come into contact. In this manner, the sealing compound is displaced in a controlled manner in the direction of the other housing part, so that there is a certain volume of sealing compound present in the join region of the three component parts.

dr

DETAILED DESCRIPTION

Figure 1:
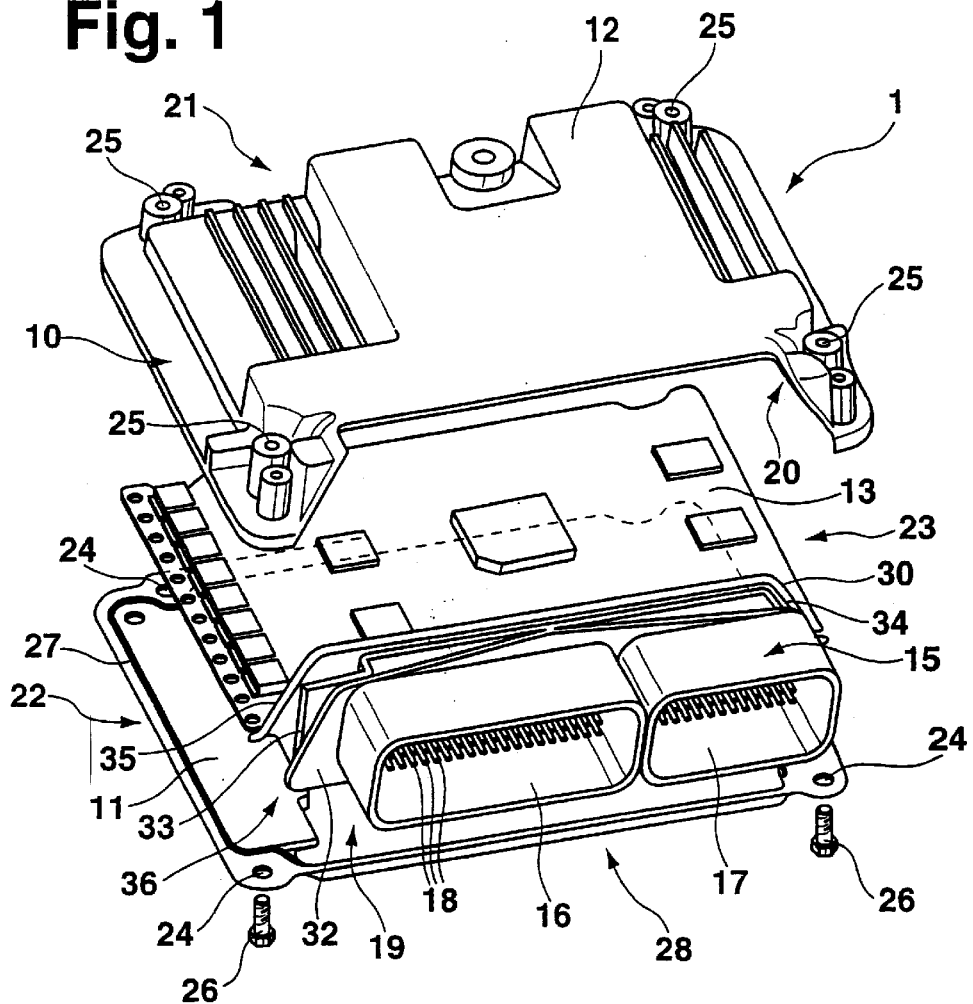
FIG. 1 is an exploded view of a control device for a motor vehicle having an exemplary housing according to the present invention.
Figure 2:
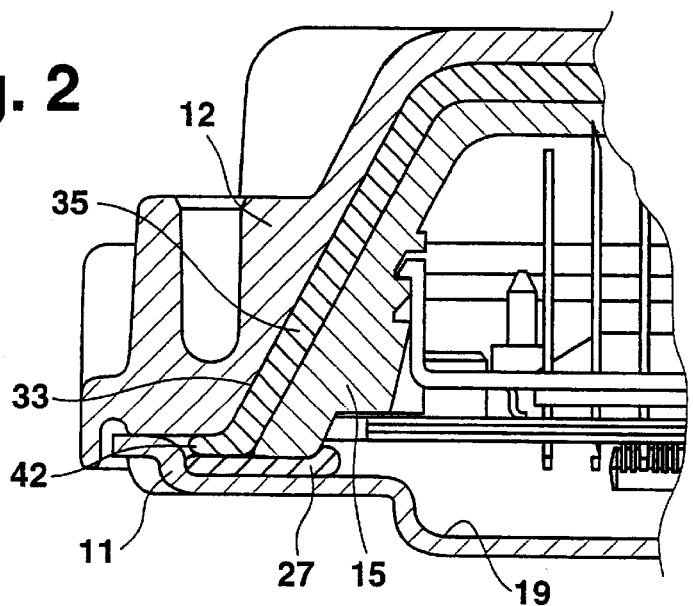
FIG. 2 is a sectional view of a control device in the critical join region.
Figure 3:
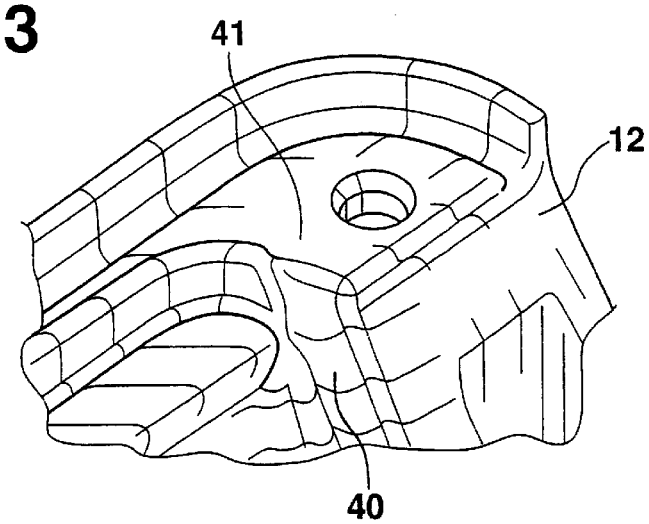
FIG. 3 is a perspective view of part of the housing cover shown in FIG. 1.
Figure 4:
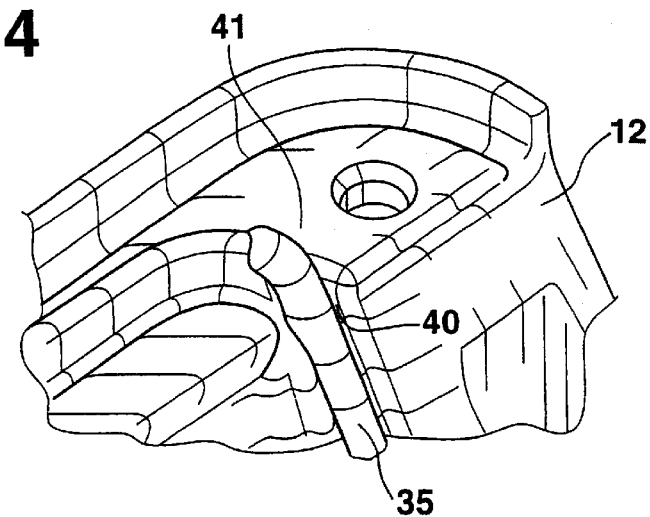
FIG. 4 shows the housing cover of FIG. 3 subsequent to the application of a sealing compound.

FIG. 1 shows the main components of an electrical control device 1 used, for example, as a switching or control device in a motor vehicle. Control device 1 has a housing 10, which is composed of a base 11 and a cover 12. In its closed state, housing 10 encloses a printed-circuit board 13, which is fitted with electrical and/or electronic components (not shown). Printed-circuit board 13 is connected to a plug body 15, which has two plug chambers 16, 17 projecting out from housing 10. Plug chambers 16, 17 encloses connector lugs 18, which are in electrical contact with the electronic components of printed-circuit board 13.

The essentially planar base 11 may be made of sheet metal and may have a depression 19, which accommodates the components positioned on the bottom side of printed-circuit board 13 and/or is set apart therefrom. Cover 12, which is either made from plastic provided with a metal-plated inner side to improve the electromagnetic capability (EMC) shield, or is designed as a metal die-cast part, has a trapezoidal formation 20 for accommodating plug body 15. On rear side 21 of control device 1 opposing plug body 15, as well as on the two housing sides 22, 23, the surfaces of base 11 are essentially planar, while cover 12 is formed with a circumferential sealing spring to ensure secure overlapping.

At each of the four corners of housing 10, a bore hole 24 is formed in base 11, and in alignment thereto, a threaded receptacle 25 in cover 12 is formed, enabling base 11 and cover 12 to be screwed together using mounting screws 26.

In base 11, on the side facing cover 12, a first seal in the form of a sealing compound 27 is circumferentially positioned in the edge area in a bead form. On rear side 21, and on both housing sides 22, 23 where the respective surfaces of base 11 and cover 12 lie directly against one another, sealing compound 27 produces an airtight and moisture-tight connection between base 11 and cover 12 when the housing parts are screwed together. On front side 28 of housing 10, from where plug body 15 projects out from housing 10, housing 10 optimizes the seal with respect to plug body 15. Plug body 15 has a circumferential intermediate wall 30 that is adapted to recessed formation 20. Intermediate wall 30 thus has a straight top side 31 that conforms to trapezoidal formation 20, a bottom side 32 disposed parallel thereto, as well as two oblique side edges 33, 34. In the assembled state of control device 1, bottom side 32 of intermediate wall 30 rests on the corresponding section of sealing compound 27, which is applied to base 11. Sealing compound 27 thus forms the seal between bottom side 32, intermediate wall 30 and base 11. To seal the two side edges 33, 34 and top side 31 of intermediate wall 30 towards cover 12, a second seal in the form of sealing compound 35 is provided, which is also applied as a bead at the appropriate locations of intermediate wall 30 in cover 12.

While the seal between intermediate wall 30 and cover 12 produced by sealing compound 35 is relatively uncritical in the areas of intermediate wall 30, where intermediate wall 30 only needs to be sealed toward cover 12, it is believed that the seal in the two lateral areas 36, where bottom side 32 of intermediate wall 30 transitions to the oblique side edges 33, 34, has presented problems heretofore. The problems may have arisen because, in areas 36, 37 of the assembled control device 1 including cover 12, base 11 and intermediate wall 30 and plug body 15, respectively, three components meet, which must be sealed to one another.

Figure 5:
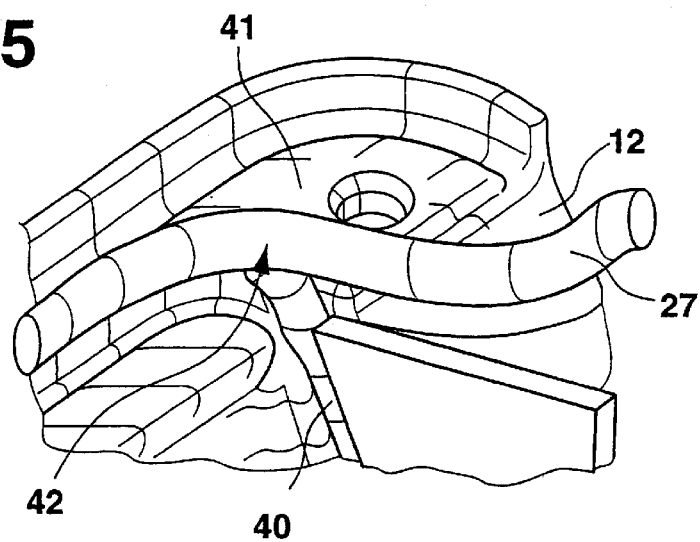
FIG. 5 shows the housing cover of FIG. 4 showing the placement of the sealing compound in the housing base, without the housing base.

An exemplary embodiment according to the present invention proposes forming a groove 40 in cover 12 and applying sealing compound 35 thereto, at least in those sections where the two lateral areas 36 of intermediate wall 30 are configured. This groove 40 terminates at a surface 41 of cover 12 where sealing compound 27 is also placed, so that the sealing compound 35 placed in groove 40 directly contacts sealing compound 27 of base 11 when cover 12 is assembled, i.e., an overlap region 42 of the two sealing compounds 27, 35 is formed when control device 1 is assembled. This relationship is shown in FIG. 5, in which, besides cover 12 with its sealing compound 35 placed in groove 40, the placement of sealing compound 27 of base 11 is also shown, without base 11.

To ensure that the two sealing compounds 27, 35 form an overlap region 42 when the components are assembled, the corresponding section of intermediate wall 30 is positioned in groove 40. In this manner, intermediate wall 30 displaces sealing compound 35 along groove 40 in the direction of overlap region 42 and of sealing compound 27, respectively, when the components are assembled.

Control device 1 is assembled in the following manner: Once sealing compound 35 is introduced into cover 12, cover 12 is placed with its top facing down. Then, printed-circuit board 13, together with plug body 15 connected thereto, is joined to cover 12 so that intermediate wall 30 is congruent with formation 20 in cover 12. The corresponding sections of intermediate wall 30 displace sealing compound 35 out of groove 40 in the direction of surface 41 of cover 12. Base 11, provided with sealing compound 27, is subsequently brought into alignment with cover 12, so that bore holes 24 align with receptacles 25. Finally, mounting screws 26 are tightened, base 11, cover 12 and intermediate wall 30 of plug body 15 being joined to one another and sealing compounds 27, 35 being squeezed together. At this stage, the assembly of control device 1 is then complete, with sealing compounds 27, 35 subsequently hardening, thereby producing the air- and moisture-tight sealing of control device 1 and housing 10, respectively.

What is claimed is:

1. An electrical device, comprising:

at least two housing parts configured to be joined to one another, the housing parts forming an opening for receiving a plug body connected to a printed-circuit board; and first and second sealing compounds provided in an area of the opening between the plug body and the housing parts, the sealing compounds being applied before the housing parts and the plug body are joined together;

wherein a first one of the housing parts is provided with a recess in an area where the housing part and the plug body come into contact, the recess receiving at least a portion of the first sealing compound, and wherein a protrusion of the plug body engages with the recess, and the recess extends directly to a second one of the housing parts receiving the second sealing compound.

2. The electrical device according to claim 1, wherein the electrical device is one of a switching and a control device of a motor vehicle.

3. The electrical device according to claim 1, wherein the recess includes a groove, and wherein the protrusion of the plug body engages with the groove in a groove-spring connection.

4. The electrical device according to claim 1, wherein the second sealing compound is applied to the second one of the housing parts in an outlet area of the recess toward the first one of the housing parts.

5. The electrical device according to claim 4, wherein the first sealing compound received in the recess of the first housing part extends up to a transitional region where the second sealing compound also extends, and an overlap area is formed between the first and second sealing compounds.

6. The electrical device according to claim 1, wherein each of the first and second sealing compounds includes a liquid to viscous sealing compound capable of being applied in the form of at least one of a bead and a cord, the first and second sealing compounds being applied at least one of in and on the housing parts, and the first and second sealing compounds hardening after the housing parts and the plug body are joined.

7. A method of assembling an electrical device, the method comprising the steps of:

applying at least a portion of a first sealing compound in a recess of a first one at least two housing parts;

applying a second sealing compound to a second one of the housing parts, the two housing parts being configured to be joined to one another, the housing parts forming an opening for receiving a plug body connected to a printed-circuit board, the first and second sealing compounds being applied in an area of the opening between the plug body and the housing parts, wherein the first one of the housing parts is provided with the recess in an area where the housing parts and the plug body come into contact, a protrusion of the plug body engages with the recess, and the recess extends directly to the second one of the housing parts; and joining the housing parts and the plug body.

8. The method according to claim 7, wherein the recess includes a groove, and wherein the protrusion of the plug body engages with the groove in a groove-spring connection.

9. The method according to claim 7, wherein the second sealing compound is applied to the second one of the housing parts in an outlet area of the recess toward the first one of the housing parts.

10. The method according to claim 9, wherein, after the housing parts and the plug body are joined, the first sealing compound extends up to a transitional region where the second sealing compound also extends, and an overlap area is formed between the first and second sealing compounds.

11. The method according to claim 7, wherein each of the first and second sealing compounds includes a liquid to viscous sealing compound capable of being applied in the form of at least one of a bead and a cord, the first and second sealing compounds being applied at least one of in and on the housing parts, and the first and second sealing compounds hardening after the housing parts and the plug body are joined.

* * * * *